United States Patent [19]

Flanner et al.

[11] Patent Number: 5,783,496
[45] Date of Patent: Jul. 21, 1998

[54] METHODS AND APPARATUS FOR ETCHING SELF-ALIGNED CONTACTS

[75] Inventors: Janet M. Flanner, Union City; Prashant Gadgil; Linda N. Marquez, both of Fremont; Adrian Doe; Joel M. Cook, both of Pleasanton, all of Calif.

[73] Assignee: Lam Research Corporation, Fremont, Calif.

[21] Appl. No.: 623,526

[22] Filed: Mar. 29, 1996

[51] Int. Cl.$^6$ .................................................. H01L 21/00
[52] U.S. Cl. ........................ 438/743; 438/723; 438/734; 438/738; 216/79; 216/72; 216/67
[58] Field of Search ........................ 216/67, 72, 79; 438/723, 724, 734, 738, 743, 744

[56] References Cited

U.S. PATENT DOCUMENTS

| | | | |
|---|---|---|---|
| 4,412,902 | 11/1983 | Michikami et al. | 204/192 E |
| 4,980,304 | 12/1990 | Chin et al. | 437/31 |
| 4,987,099 | 1/1991 | Flanner | 437/192 |
| 5,286,667 | 2/1994 | Lin et al. | 437/52 |
| 5,374,332 | 12/1994 | Koyama et al. | 156/643 |
| 5,637,237 | 6/1997 | Oehrlein et al. | 216/67 |

*Primary Examiner*—M. Nuzzolillo
*Assistant Examiner*—Steven H. VerSteeg

[57] ABSTRACT

A method in a plasma processing chamber for fabricating a semiconductor device having a self-aligned contact. The method includes the step of providing a wafer having a substrate, a polysilicon layer disposed above the substrate, a nitride layer disposed above a polysilicon layer, and an oxide layer disposed above the nitride layer. The method further includes the step of etching in a first etching step partially through the oxide layer of the layer stack with a first chemistry and a first set of process parameters. In this first etching step, the first chemistry comprises essentially of $CHF_3$ and $C_2HF_5$. The method also includes the step of etching the oxide layer in a second etching step through to the substrate with a second chemistry comprising $CHF_3$ and $C_2HF_5$ and a second set of process parameters. The second set of process parameters is different from the first set of process parameters and represents a set of parameters for etching the oxide layer with a higher oxide-to-nitride selectivity than the oxide-to-nitride selectivity achieved in the first etching step.

21 Claims, 6 Drawing Sheets

| PARA-METER | TREND FROM FIRST ETCH STEP TO SECOND ETCH STEP | PREFERRED RANGE | | MORE PREFERRED RANGE | | PREFERRED VALUE | |
|---|---|---|---|---|---|---|---|
| | | First | Second | First | Second | First | Second |
| PRESSURE (mTorr) | REDUCE | 4-20 | >0-5 | 5-15 | 0.5-3 | 10 | 1 |
| POWER TOP TCP ELECTRODE (Watts) | REDUCE | 700-2000 | 700-1950 | 800-1800 | 750-1700 | 1000 | 900 |
| POWER BOTTOM RF BIAS (Watts) | INCREASE | 800-1400 | 1000-1500 | | | 950 | 1350 |
| CHF$_3$ (sccm) | INCREASE | 5-25 | 5-25 | | | 10 | 15 |
| C$_2$HF$_5$ (sccm) | INCREASE | 5-25 | 5-25 | | | 10 | 15 |
| CF$_4$ (sccm) | INCREASE | 0-10 | 0-10 | 0-5 | 0-5 | 0 | 3 |

FIG. 4

METHODS AND APPARATUS FOR ETCHING SELF-ALIGNED CONTACTS

BACKGROUND OF THE INVENTION

The present invention relates to the fabrication of semiconductor integrated circuits (IC's). More particularly, the present invention relates to methods and apparatuses for etching through an IC's layer stack, including the oxide layer, during IC fabrication to create self-aligned contact openings.

In the manufacture of certain semiconductor integrated devices such as metal oxide semiconductor (MOS) transistors, self-aligned contacts offer many advantages. To facilitate discussion, FIGS. 1A and 1B illustrate cross-sectional views of the relevant portion of a layer stack 20, representing the layers formed during the fabrication of a typical semiconductor IC that employs self-aligned contacts. It should be noted that other additional layers above, below, or between the layers shown may be present. Consequently, as the term is used herein, relative positional terms such as "over" or "above" do not necessarily indicate a direct contact between the layers under discussion. Further, not all of the shown layers need necessarily be present and some or all may be substituted by other different layers.

Referring initially to FIG. 1A, there is shown a substrate 22 at the bottom of layer stack 20 (not drawn to scale for ease of illustration). Substrate 22 represents a semiconductor wafer, which is typically formed of silicon. Oxide layers 24 and 26, typically comprising $SiO_2$, are formed above substrate 22 to serve as the gate oxide layer. Above gate oxide layers 24 and 26, there are disposed respective polysilicon gates 28 and 30. Each of these polysilicon gates 28 and 30 is protected by a nitride region of a subsequently deposited nitride layer ($Si_3N_4$ or $Si_xN_y$ generally). In FIG. 1A, these nitride regions are shown as nitride regions 32 and 34. Above the gate oxide regions, the polysilicon gates, and the protective nitride regions, there is disposed an oxide layer 40.

To create a contact opening 44 to substrate 22 through oxide layer 40, a layer of photoresist material 42 is deposited and patterned using a conventional photolithography step. After patterning, an initial opening is created in photoresist layer 42 to facilitate subsequent oxide etching. The above-described layers and features, as well as the processes involved in their creation, are well known to those skilled in the art.

FIG. 1B shows the same layer stack 20 of FIG. 1A and its layers. In FIG. 1B, however, a contact opening 44 has been etched through oxide layer 40. Through this contact opening 44, a metal conductor may be formed subsequently to contact the drain and source regions in substrate 22. By way of example, side-wall 52 of contact opening 44 may be etched such that contact opening 44 contacts source or drain regions in substrate 22. In the present case, contact opening 44 represents a self-aligned contact, i.e., it performs its contacting function irrespective of whether the sidewalls of the contact opening overlap all or part of the gate stack comprising the gate oxide region, the polysilicon gate, and the protective nitride layer. Since the polysilicon gates themselves are protected by the overlaying nitride material, some misalignment between region D1 between the gate stacks and contact opening 44 may be present without shorting the gate of the resulting transistor to its drain and source. By way of example, sidewall 50 of contact opening 44 is shown overlapping polysilicon gate 28. Nevertheless, the presence of nitride region 32 electrically insulates polysilicon gate 28 from the conductive contact material subsequently deposited into contact opening 44.

The use of self-aligned contacts advantageously permits circuit designers greater flexibility in the placement of the contact openings. In some instances, the use of self-aligned contacts permits circuit designers to pack the gates more closely together since the minimal distance between the gates is not bounded by the dimension of the contact opening (which is limited by, for example, the accuracy of the photolithography and the oxide etch processes).

As can be appreciated by those skilled in the art, the above-described self-aligned contact technique requires that the contact opening, e.g., contact opening 44 of FIG. 1B, be etched without damage to the insulating nitride regions that overlay the polysilicon gates. In other words, it is desirable to etch the contact opening with an oxide etch process that has a high oxide-to-nitride selectivity. To ensure an adequate contact area between the subsequently deposited metal layer and the wafer, it is desired that the etch profile be as close to the desired vertical profile as possible with little or no unetched oxide sticking to the nitride sidewall. It is also desirable when etching contact openings to improve the oxide etch rate in order to increase the wafer throughput rate. Additionally, it is also desirable to etch contact openings with a uniform etch rate across the wafer so that dies that are located in the center of the wafer are etched at the same rate as dies that are located at the wafer edge.

In view of the foregoing, what is desired is improved methods and apparatuses for etching self-aligned contacts. Among other advantages, the improved methods and apparatuses preferably maximize the oxide etch rate, the oxide-to-nitride selectivity, and etch uniformity, while improving the etch profile.

SUMMARY OF THE INVENTION

The invention relates, in one embodiment, to a method in a plasma processing chamber for etching through a selected portion of an oxide layer of a wafer's layer stack to create a self-aligned contact opening. The wafer stack includes a substrate, typically formed of silicon, and a polysilicon layer disposed above the substrate. There is further included a nitride layer disposed above a polysilicon layer. The oxide layer is disposed above the nitride layer. The aforementioned method includes a first etching step for etching partially through the oxide layer of the layer stack with a first chemistry and a first set of process parameters. The first chemistry comprises essentially of $CHF_3$ and $C_2HF_5$. In this first step, the first set of process parameters represents a set of parameters for etching through the oxide layer without creating a spiked etch.

The method further includes a second etching step for etching the oxide layer through to the substrate with a second chemistry comprising $CHF_3$ and $C_2HF_5$ and a second set of process parameters. The second set of process parameters is different from the first set of process parameters and represents a set of parameters for etching the oxide layer through to the substrate without substantially damaging the nitride layer.

In another embodiment, the invention relates to a method in a plasma processing chamber for fabricating a semiconductor device having a self-aligned contact. The method includes the step of providing a wafer having a substrate, a polysilicon layer disposed above the substrate, a nitride layer disposed above a polysilicon layer, and an oxide layer disposed above the nitride layer. The method further includes the step of etching in a first etching step partially through the oxide layer of the layer stack with a first chemistry and a first set of process parameters. In this first etching step, the first chemistry comprises essentially of $CHF_3$ and $C_2HF_5$.

The method also includes the step of etching the oxide layer in a second etching step through to the substrate with a second chemistry comprising $CHF_3$ and $C_2HF_5$ and a second set of process parameters. The second set of process parameters is different from the first set of process parameters and represents a set of parameters for etching the oxide layer with a higher oxide-to-nitride selectivity than the oxide-to-nitride selectivity achieved in the first etching step.

These and other advantages of the present invention will become apparent upon reading the following detailed descriptions and studying the various drawings.

BRIEF DESCRIPTION OF THE DRAWINGS

FIG. 4 is a table showing, in accordance with one embodiment of the present invention, the approximate preferred values for the process parameters of the first etching step and the second etching step.

DETAILED DESCRIPTION OF THE PREFERRED EMBODIMENTS

An invention is described for achieving, among others, improved oxide etch rate, oxide-to-nitride selectivity, etch uniformity, and etch profile during the etching of self-aligned contact openings. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 2:
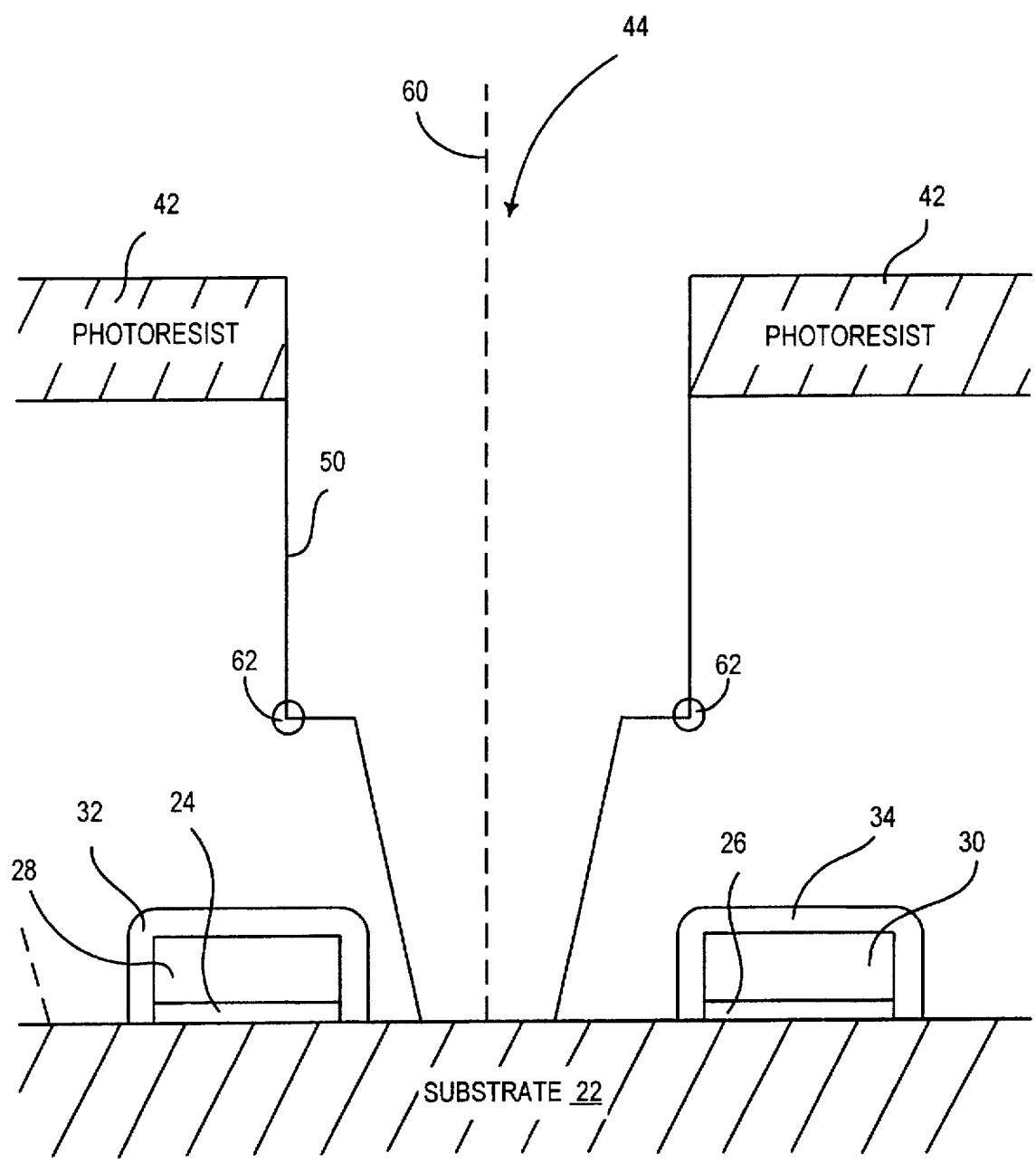
FIG. 2 illustrates a spiked etch that is formed on the sidewall of a self-aligned contact opening.

In accordance with one embodiment of the present invention, the aforementioned self-aligned contact openings are etched with a two-step etch process, which employs $CHF_3$, $C_2HF_5$ and optionally $CF_4$ and/or $C_2F_6$ as etchant source gases in a plasma processing chamber. In the first etch step, the contact opening is preferably etched with a first set of process parameters that is designed to, among others, prevent the occurrence of a spiked etch. As the term is employed herein, a spiked etch represents a distortion in the etch sidewall such that the contact opening becomes progressively narrower at the bottom of the etch. As illustrated in FIG. 2, contact opening 44 is said to have a spiked etch when its sidewalls taper toward the contact opening center line 60 starting from a threshold position 62. In some cases, the critical dimension of the contact opening may narrow before the contact opening sidewalls begin to taper toward center line 60.

The second etch step is then performed with a second set of process parameters that is optimized to increase, among others, the oxide-to-nitride selectivity. As noted earlier, increased oxide-to-nitride selectivity advantageously reduces the chance, during the etching of the contact openings, of damaging the protective nitride regions that overlay the polysilicon gates.

The inventive two-step self-aligned contact opening etch technique may be performed in any of the known plasma processing apparatuses, including those adapted for dry etching, plasma etching, reactive ion etching (RIE), magnetically enhanced reactive ion etching (MERIE), electron cyclotron resonance (ECR), or the like. To further elaborate, in a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma. ECR and TCP™ (transformer coupled plasma) processing systems, among others, are readily available commercially. TCP™ systems represent a class of high density plasma systems and are available from, for example, Lam Research Corporation of Fremont, Calif.

Figure 3:
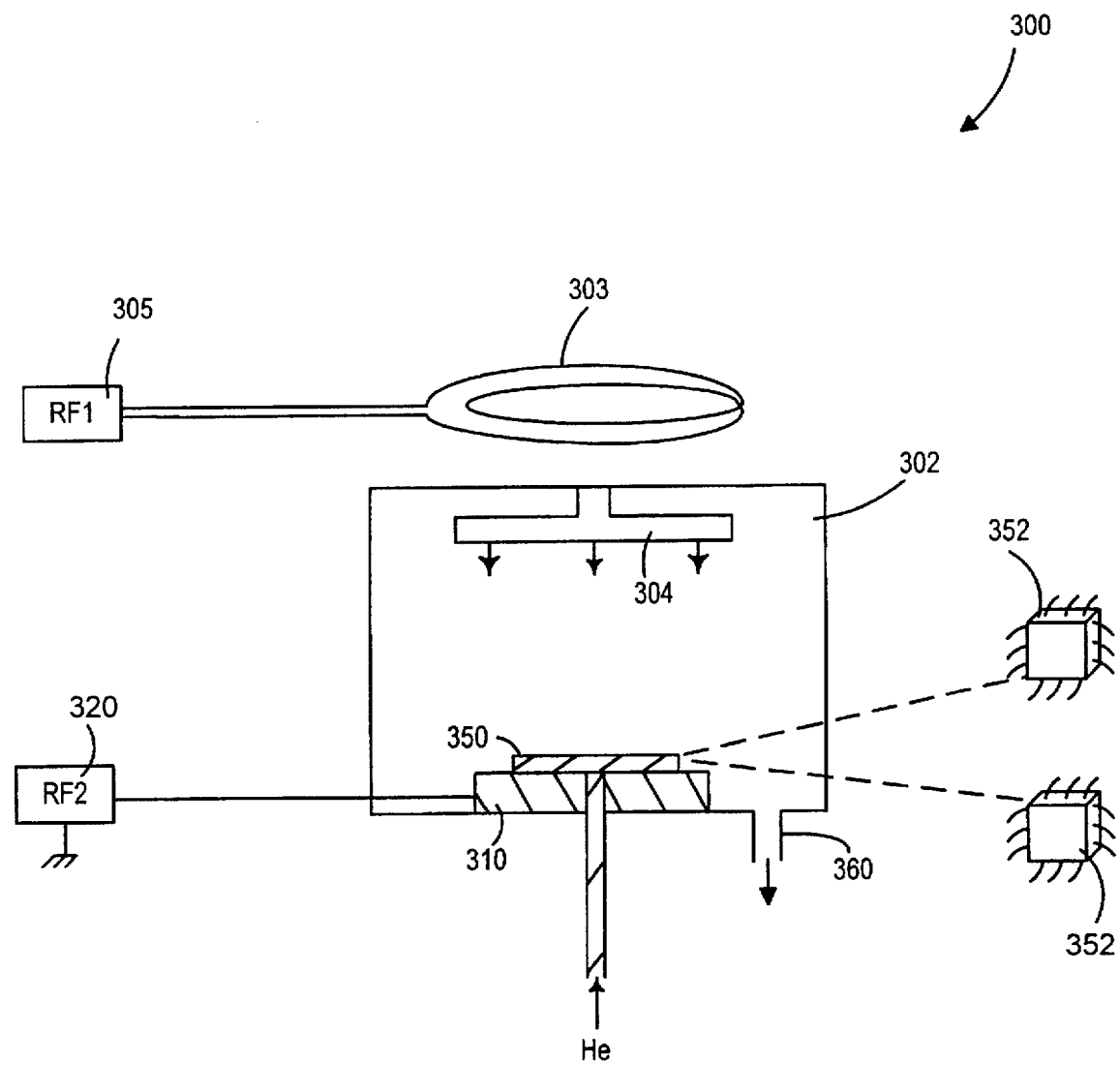
FIG. 3 is a simplified schematic diagram of a plasma reactor that may be suitably employed with the inventive two-step contact-opening etch technique.

In a preferred embodiment, the present invention is practiced in a TCP™ 9100 plasma reactor, which is available from Lam Research Corporation, although, as mentioned above, any conventional and suitable plasma processing systems may well be employed. FIG. 3 illustrates a simplified schematic of the TCP™ 9100 plasma reactor, including wafer 350 and integrated circuit chips 352, which are fabricated from dies cut from wafer 350 after the wafer is etched according to the inventive two-step self-aligned contact opening etch and processed in conventional post-etch steps. Referring to FIG. 3, a wafer reactor 300 includes a plasma processing chamber 302. Above chamber 302, there is disposed an electrode 303, which is implemented by a coil in the example of FIG. 3. Coil 303 is energized by a radio frequency generator (RF1) generator 305 via a matching network (not shown in FIG. 3).

Within chamber 302, there is typically provided a shower head 304, which preferably includes a plurality of holes for releasing gaseous source materials, e.g., the etchant source gases, into the RF-induced plasma region between shower head 304 and a wafer 350. The gaseous source materials may also be released from ports built into the walls of the chamber itself. Wafer 350 is introduced into chamber 302 and disposed on a chuck 310, which acts as a second electrode and is preferably biased by a radio frequency generator (RF2) 320 (also typically via a matching network). Wafer 350 may be secured to chuck 320 using a conventional mechanical clamping technique or one that employs electrostatic clamping forces.

Helium cooling gas is introduced under pressure (e.g., about 15 Torr in one embodiment) between chuck 310 and wafer 350 to act as a heat transfer medium for accurately controlling the wafer's temperature during processing to ensure uniform and repeatable etching results. During plasma etching, the pressure within chamber 302 is preferably kept low by withdrawing gas through port 360, e.g., between slightly above 0 mTorr to about 20 mTorr during contact opening etching. A plurality of heaters (omitted from FIG. 3 to simplify the illustration) may be provided to maintain a suitable chamber temperature for etching. To provide an electrical path to ground, the chamber wall of chamber 302 is typically grounded.

In the description that follows, various process parameters are varied between the first etching step and the second etching step. In some cases, the change in the value of a single parameter, e.g., chamber etch pressure, may by itself produce the desired result. It appears, however, that improved etch results may also be achieved when more than two or more process parameters, e.g., both the chamber etch pressure and the etchant source gases, are varied between the first etching step and second etching step. Consequently, it should be understood from the description below that more than one or all of the process parameters mentioned may be changed as the etch proceeds from the first etching step to the second etching step.

As mentioned, both etching steps are performed using the $CHF_3/C_2HF_5$ chemistry. In the second etch step wherein the oxide to nitride selectivity is preferably increased, $CF_4$ and/or $C_2F_6$ may be added to the etchant source gas in one embodiment. It is believed that the addition of $CF_4$ in particular in the second etching step advantageously enhances the removal of oxide residues.

In accordance with one aspect of the present invention, the chamber etch pressure is advantageously decreased from the first etching step to the second etching step. For example, the chamber etch pressure was reduced from about 10 mTorr to about 1 mTorr in one experiment. It is believed that if the lower chamber etch pressure, e.g., about 1 mTorr, had been employed in both the first and the second etching step, a spiked etch would result. The use of a higher chamber etch pressure in the first etching step tends to minimize the possibility that a spiked etch may occur. In the second etching step, a lower chamber etch pressure is believed to be a factor in improving the oxide-to-nitride resistivity, advantageously resulting in less damage to the protective nitride layer that overlays the polysilicon gates.

In another aspect of the present invention, the top TCP power is advantageously decreased from the first etch step to the second etch step while the RF bias power supplied to the lower chuck electrode is advantageously increased from the first etch step to the second etch step. Sample values for these power levels are illustrated in FIG. 4 herein. It is believed that the use of a higher RF bias power level in the second etch step enhances the removal of oxide residues.

In yet another aspect of the present invention, the flow rate of each of the etchant source gas components, i.e., $CHF_3$ and $C_2HF_5$, is advantageously increased from the first etching step to the second etching step. It is believed that the increased flows of these etchant source gas components advantageously enhances the selectivity of the oxide to the nitride and the substrate.

In accordance with one aspect of the invention, the first etching step is preferably permitted to continue as far down into the oxide layer as possible without damaging the protective nitride layer. This is because the first etching step is optimized to minimize the possibility of a spiked etch while achieving commercially advantageous etch rate, uniformity, and etch rate loading values.

Figure 1A:
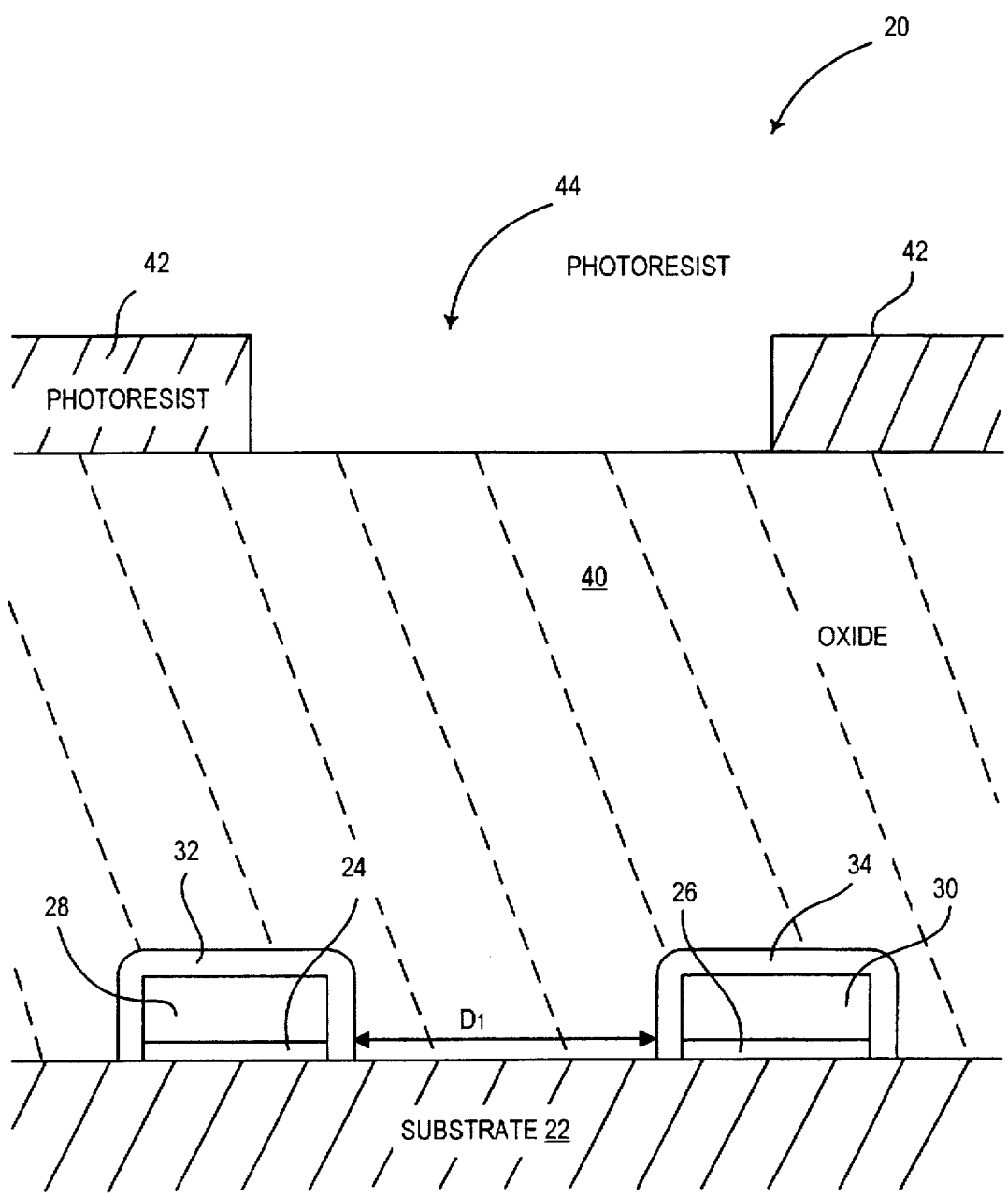
FIG. 1A illustrates a cross-sectional view of a layer stack, representing the layers formed during the fabrication of a typical semiconductor IC that employs self-aligned contacts.
Figure 1B:
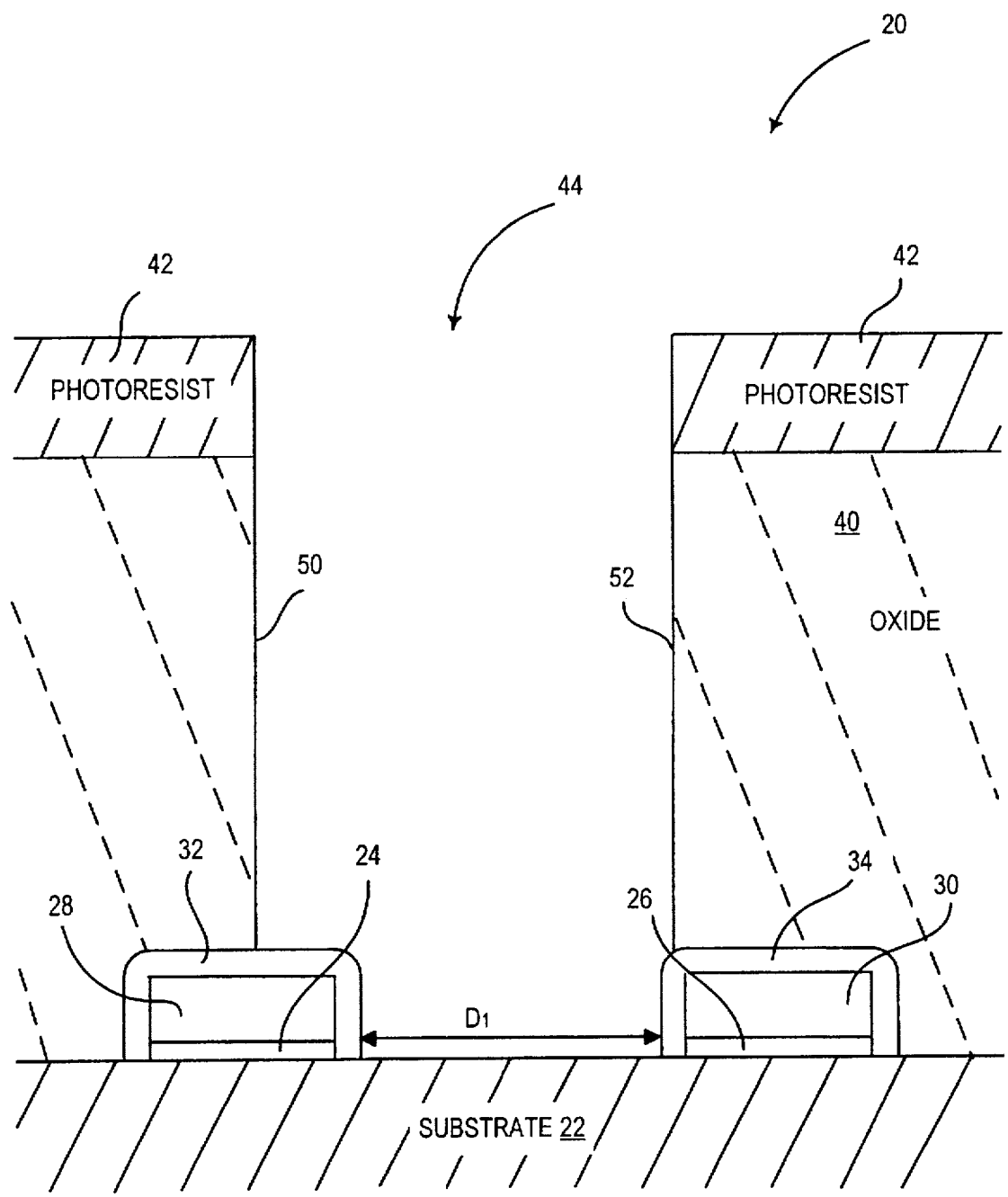
FIG. 1B shows the same layer stack of FIG. 1A after a self-aligned contact opening has been etched through to the oxide layer.

In one embodiment, the first etching step is terminated when it reaches a predefined location above the plane formed by the top of the protective nitride features (herein "top-of-nitride-layer plane"), e.g., the plane formed by the top of nitride layers 32 and 34 of FIG. 1A. The predefined location where this first etching step terminates is preferably in the range between about the top-of-nitride-layer plane and about 1,000 angstroms above this top-of-nitride-layer plane. More preferably, the predefined location is in the range between about the top-of-nitride-layer plane and about 250 angstroms above this top-of-nitride-layer plane. Even more preferably, the predefined location is about even with the top-of-nitride-layer plane.

Note that while a higher oxide-to-nitride selectivity may cause a spiked etch if employed in the first etching step, the fact that the second etching step has a higher oxide-to-nitride selectivity does not necessarily mean that a poor quality self-aligned contact opening will result. This is because the self-aligned contact opening is etched first with a set of process parameters that has a lower oxide-to-nitride selectivity and is not etched with the higher oxide-to-nitride selectivity recipe until the etch has advanced fairly deeply into the oxide layer. If any spiked etch is formed by this higher selectivity recipe, it does not have a chance to start until the contact opening is nearly etched through and its effect on the etch profile would therefore be minimal. As can be appreciated by those skilled in the art, this aspect of the invention tends to improve the chance that the contact etch profile would be more vertical and have less unetched oxide residues clinging to the nitride sidewalls (due to the high selectivity second etching step) while reducing incidents of spiked etch.

FIG. 4 is a table showing the approximate preferred values for the process parameters of the first etching step and the second etching step. It is believed that values in the preferred ranges and the more preferred ranges shown are also suitable for performing the inventive two-step self-aligned contact opening etch. It should be borne in mind that the values shown in FIG. 4 are obtained while etching a 6" silicon wafer, which is disposed on a mechanical chuck in a TCP™ 9100 Lam oxide plasma etching system.

Table 1 below shows the approximate process results obtained from the experiment of FIG. 4. As can be shown in Table 1, the inventive etch process results in highly advantageous etch rates, uniformity, and oxide-to-nitride selectivity. Further, damage to the protective nitride layer that overlays the polysilicon gates was observed to be minimal. The etch profile within the contact opening was observed to be relatively free of grass, i.e., the oxide residue that is often left behind after etching due to nonuniformity in the deposition of the oxide material.

TABLE 1

| PARAMETER | PROCESS RESULTS | |
| --- | --- | --- |
| | First Etch Step | Second Etch Step |
| Etch Rate (Angstroms/min) | 10,600 | 15,000 |
| Uniformity (1 σ) | 2% | 5% |
| Oxide-to-Nitride Selectivity | 1:1 | 20:1 (wafer) |
| | | 24:1 (center) |

It will be apparent to those skilled in the art in light of this disclosure to modify the values disclosed herein as appropriate to etch in other plasma etching systems, to etch wafers and substrates having other dimensions, and/or employing other types of chucks. In particular, it is believed that the inventive two-step self-aligned contact etching technique disclosed herein work well with electrostatic (ESC) chucks and/or 8" wafers.

Figure 5:
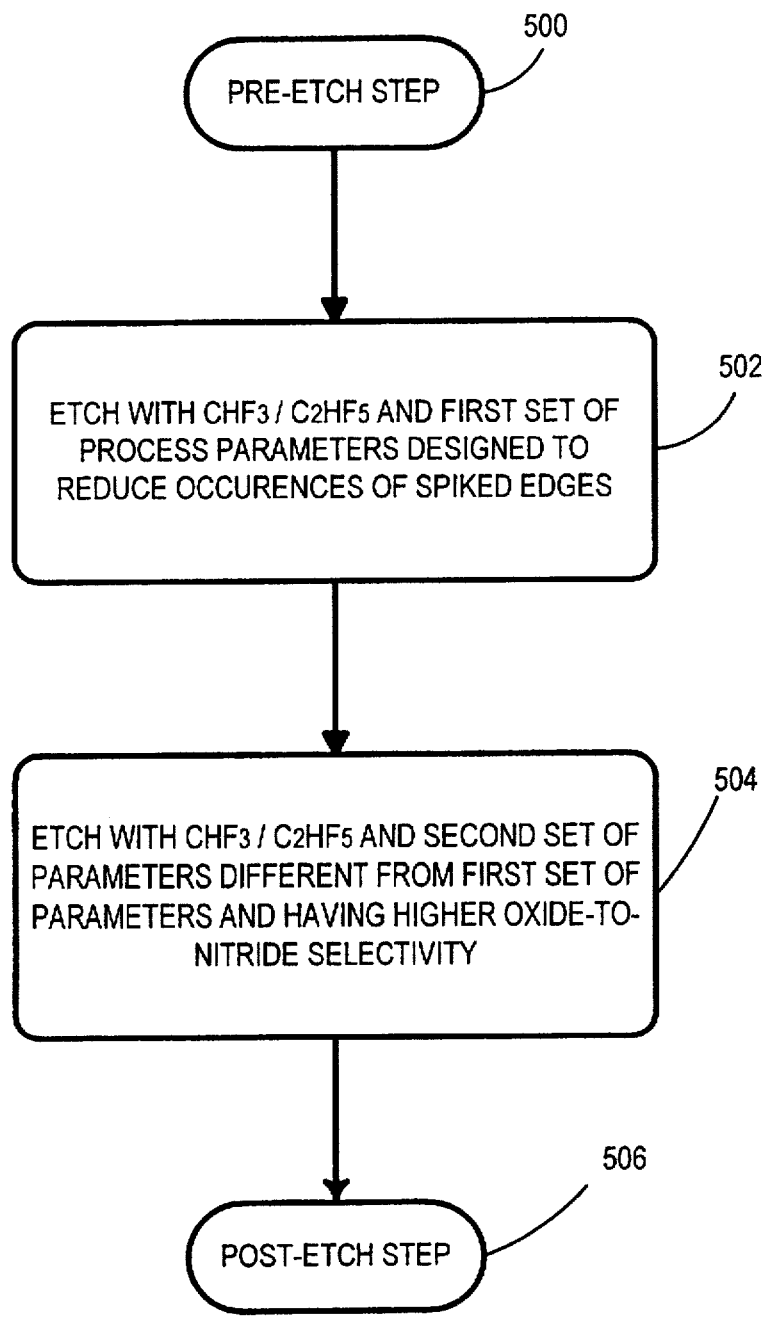
FIG. 5 shows, in accordance with one aspect of the present invention, the steps involved in the inventive two-step self-aligned contact opening etch process.

FIG. 5 shows, in accordance with one aspect of the present invention, the steps involved in the inventive two-step self-aligned contact opening etch process. In step 500, a wafer is prepared for etching in a conventional pre-etch step. The pre-etch step may include, for example, depositing and patterning the photoresist layer on the wafer, clamping the wafer onto the chuck, stabilizing the pressure within the plasma processing chamber, and introducing helium cooling gas to the wafer backside to facilitate heat transfer between the wafer and the chuck.

In the first etch step 502, the oxide layer, e.g., oxide layer 40 of FIG. 1A, is etched using a set of process parameters that is designed to minimize the occurrences of spiked etches. Preferably but not necessarily, the first etch step 502 is performed at a chamber etch pressure that is higher than the chamber etch pressure employed in a subsequent second etch step. The higher chamber etch pressure is believed to reduce the likelihood of a spiked etch. As noted, the first etch step is allowed to advance into the oxide layer as far as possible without causing damage to the protective nitride layer that overlays the polysilicon features.

In the second etch step 504, the set of process parameters is modified to improved the oxide-to-nitride selectivity. This second etching step preferably proceeds until the self-aligned contact opening is etched through to the underlying substrate. The use of a high oxide-to-nitride selectivity recipe in this second etching step advantageously minimizes damage to the protective nitride layer and ensures the substantial removal of oxide from the contact hole, including oxide residue on the nitride sidewalls. In this manner, the first etching step does not have to suffer the adverse consequences typically associated with a high selectivity recipe, e.g., the increased likelihood of a spiked etch.

In step 506, the wafer may undergo additional processing steps to fabricate the desired components as well as post-etch processing steps that are conventional in nature. Thereafter, the finished wafer may be cut into dies, which may then be made into IC chips. The resulting IC chip, e.g., IC chips 352 of FIG. 3, may then be incorporated in an electronic device, e.g., any of the of well known commercial or consumer electronic devices, including digital computers.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, a method for etching through a selected portion of an oxide layer of a wafer's layer stack to create a self-aligned contact opening, said wafer stack comprising a substrate, a polysilicon layer disposed above said substrate, a nitride layer disposed above a polysilicon layer, said oxide layer being disposed above said nitride layer, said method comprising:

a first etching step for etching partially through said oxide layer of said layer stack with a first chemistry and a first set of process parameters, said first chemistry comprising essentially of $CHF_3$ and $C_2HF_5$, said first set of process parameters represents a set of parameters for etching through said oxide layer without creating a spiked etch; and a second etching step for etching said oxide layer through to said substrate with a second chemistry comprising $CHF_3$ and $C_2HF_5$ and a second set of process parameters, said second set of process parameters being different from said first set of process parameters and representing a set of parameters for etching said oxide layer through to said substrate without substantially damaging said nitride layer.

2. The method of claim 1 wherein said second chemistry further comprises $CF_4$.

3. The method of claim 1 wherein said second chemistry further comprises $C_2F_6$.

4. The method of claim 1 wherein said first set of process parameters results in a lower oxide-to-nitride selectivity in said first etching step than an oxide-to-nitride selectivity achieved in said second etching step using said second process parameters.

5. The method of claim 4 wherein said first etching step terminates upon reaching a predefined position, said predefined position being in the range of about 1,000 angstroms above a plane defined by a top surface of said nitride layer to a position that substantially equals a midpoint of said nitride layer.

6. The method of claim 4 wherein said first etching step terminates upon reaching a predefined position, said predefined position being in the range of about 250 angstroms above a plane defined by a top surface of said nitride layer to a position that substantially equals a midpoint of said nitride layer.

7. The method of claim 4 wherein said first etching step terminates upon substantially reaching a plane defined by a top surface of said nitride layer.

8. The method of claim 4 wherein said first set of process parameters comprises a first chamber etch pressure and said second set of process parameters comprises a second chamber etch pressure lower than said first chamber etch pressure.

9. The method of claim 8 wherein said first etching step is performed with a first flow rate for said $CHF_3$ and a second flow rate for said $C_2HF_5$, said second etching step is performed with a third flow rate for said $CHF_3$ higher than said first flow rate, said second etching step is performed with a fourth flow rate for said $C_2HF_5$ higher than said second flow rate.

10. The method of claim 4 wherein said first etching step is performed with a first flow rate for said $CHF_3$ and a second flow rate for said $C_2HF_5$, said second etching step is performed with a third flow rate for said $CHF_3$ higher than said first flow rate, said second etching step is performed with a fourth flow rate for said $C_2HF_5$ higher than said second flow rate.

11. The method of claim 1 wherein said second set of process parameters results in a higher oxide-to-nitride selectivity in said second etching step than an oxide-to-nitride selectivity achieved in said first etching step.

12. The method of claim 1 wherein said plasma processing chamber represents a plasma processing chamber in a transformer coupled plasma etch system.

13. In a plasma processing chamber, a method for fabricating a semiconductor device having a self-aligned contact, said method comprising:

providing a wafer having a substrate, a polysilicon layer disposed above said substrate, a nitride layer disposed above a polysilicon layer, said oxide layer being disposed above said nitride layer;

etching in a first etching step partially through said oxide layer of said layer stack with a first chemistry and a first set of process parameters, said first chemistry comprising essentially of $CHF_3$ and $C_2HF_5$; and etching said oxide layer in a second etching step through to said substrate with a second chemistry comprising $CHF_3$ and $C_2HF_5$ and a second set of process parameters, said second set of process parameters being different from said first set of process parameters and representing a set of parameters for etching said oxide layer with a higher oxide-to-nitride selectivity than an oxide-to-nitride selectivity achieved in said first etching step.

14. The method of claim 13 wherein said second chemistry further comprises $CF_4$.

15. The method of claim 13 wherein said first etching step terminates upon reaching a predefined position, said predefined position being in the range of about 1,000 angstroms above a plane defined by a top surface of said nitride layer to a position that substantially equals a midpoint of said nitride layer.

16. The method of claim 13 wherein said first etching step terminates upon reaching a predefined position, said predefined position being in the range of about 250 angstroms above a plane defined by a top surface of said nitride layer to a position that substantially equals a midpoint of said nitride layer.

17. The method of claim 13 wherein said first etching step terminates upon substantially reaching a plane defined by a top surface of said nitride layer.

18. The method of claim 14 wherein said first set of process parameters comprises a first chamber etch pressure and said second set of process parameters comprises a second chamber etch pressure lower than said first chamber etch pressure.

19. The method of claim 18 wherein said first etching step is performed with a first flow rate for said $CHF_3$ and a second flow rate for said $C_2HF_5$, said second etching step is performed with a third flow rate for said $CHF_3$ higher than said first flow rate, said second etching step is performed with a fourth flow rate for said $C_2HF_5$ higher than said second flow rate.

20. The method of claim 14 wherein said plasma processing chamber represents a plasma processing chamber in a high density plasma etch system.

21. The method of claim 20 wherein said high density plasma etch system represents a transformer coupled plasma etch system.

* * * * *